United States Patent [19]

Turnbull

[11] Patent Number: 5,058,250
[45] Date of Patent: Oct. 22, 1991

[54] MANUFACTURE OF ELECTRICAL TRANSDUCER DEVICES, PARTICULARLY INFRARED DETECTOR ARRAYS

[75] Inventor: Andrew A. Turnbull, Reigate, England

[73] Assignee: U.S. Philips Corp., New York, N.Y.

[21] Appl. No.: 530,128

[22] Filed: May 29, 1990

[30] Foreign Application Priority Data

Jun. 12, 1989 [GB] United Kingdom ............... 8913450
Oct. 11, 1989 [GB] United Kingdom ............... 8922913

[51] Int. Cl.$^5$ ........................................... H04R 17/00
[52] U.S. Cl. ................................ 29/25.35; 250/338.2; 310/800
[58] Field of Search ....................... 29/25.35; 310/800; 250/338.2, 338.3

[56] References Cited

U.S. PATENT DOCUMENTS 4,672,254 6/1987 Dolat et al. ...................... 29/25.35

FOREIGN PATENT DOCUMENTS 0053490 6/1982 European Pat. Off. .
0073904 3/1983 European Pat. Off. .
0192349 8/1986 European Pat. Off. .
2096402 10/1982 United Kingdom .

Primary Examiner—P. W. Echols
Attorney, Agent, or Firm—William L. Botjer

[57] ABSTRACT

An infrared detector array or other electrical transducer device comprising an electrically-active film (10) of polymer material is manufactured with a pattern of electrodes (11) embedded at one face of the film (10). The electrodes (11) are formed on a support (4,5) as a photolithographically defined pattern of deposited material. These electrodes (11) are then transferred to the film (10) by depositing the film material on the support (4,5) and over the electrodes (11) and removing the support (4,5) at least at the area of the electrodes (11). The polymer material of the film (10) bonds well to the electrodes (11). In this manner, fine-geometry patterns of thin electrodes (11) can be formed embedded in the face of the film (10) and having reproduceable electrode characteristics for charge detection at the film faces in piezoelectric pyroelectric and ferroelectric devices. The bulk (5) of the support may be of glass dissolvable in HF, and it may have a conductive surface layer (4) which protects the film against the HF and connects the electrodes (11) together when applying an electric field across the film (10) to pole the polymer material, e.g. for a pyroelectric infrared detector.

15 Claims, 2 Drawing Sheets

MANUFACTURE OF ELECTRICAL TRANSDUCER DEVICES, PARTICULARLY INFRARED DETECTOR ARRAYS

BACKGROUND OF THE INVENTION

This invention relates to methods of manufacturing an electrical transducer device (particularly, but not exclusively, an infrared detector array) comprising an electrically active film of polymer material. It relates particularly, but not exclusively, to the provision of a fine-geometry pattern of thin electrodes at one face of a copolymer film with pyroelectric and/or ferroelectric properties for a linear array or 2-dimensional array of infrared detector elements, for example for a comparatively inexpensive thermal-image sensing device or a camera. The invention also relates to electrical transducer devices manufactured by such methods, and to such devices comprising a polymer film with pyroelectric and/or ferroelectric and/or piezoelectric properties and having electrodes supported by the film.

In the manufacture of thermal detectors and other transducer devices there is a current trend towards adopting electrically active films of polymer materials, for example polyvinylidene fluoride (PVDF) or vinylidene fluoride trifluoroethylene to form the pyroelectric and/or ferroelectric active dielectric layer of the infrared detector elements (instead of using the formerly more conventional ceramic materials such as, for example, lanthanum-doped lead zirconate titanate, PLZT). Many publications have occurred on how devices can be constructed using these polymer materials. By way of example, reference is made to published European patent application EP-A-0 269 161 which corresponds to U.S. Pat. No. 4,806,763 and to U.S. Pat. No. 4,532,424 and 4,250,384, the whole contents of which are hereby incorporated herein as reference material.

These known polymer-film devices comprise a group of first electrodes at a first face of the film and at least one second electrode at the second face of the film opposite the first electrodes so as to define with the intermediate areas of the film a group of the infrared detector elements. Due to the pyroelectric properties of the film, electric charges are generated at first and second opposite faces of the film in operation of the device, and the first and second electrodes form electrical connections to the film for detecting the generated charges. It is customary to apply both the first and second electrodes to a preformed film by coating the film with electrode material, or possibly in some cases by laminating the preformed film with electrodes which may be carried on or in a support. A pattern of the first electrodes is normally defined by localized deposition of the electrode material through openings in a stencil mask held in contact with the film or with the support on which the electrodes are being deposited. A support (such as a glass slide) is often employed in experimental test structures and may sometimes be used in manufactured devices (for example a glass or plastic substrate may form a lens pattern in the device structure). Usually, however, in commercial, high performance infrared detectors of pyroelectric and/or ferroelectric polymer film material, at least most of the area of the film where the detector elements are present is free of contact with the mount arrangement used to support the film in the device, so as to reduce thermal conduction to and from the detector elements. In the specific arrangement illustrated by way of example in EP-A-0 269 161, the electroded film is supported at its periphery on an insulating annulus. In the specific embodiment of U.S. Pat. No. 4,532,424, bumped contacts form the mounting arrangement to space the electroded film above a semiconductor signal-processing circuit. In specific embodiments of U.S. Pat. No. 4,250,384, electroded etched dips are present in a semiconductor substrate to provide thermal barriers in the mounting arrangement of the electroded film.

The present inventor has found that the use of a stencil mask to define the group of first electrodes is not always satisfactory, especially for the definition of fine-geometry patterns and so has considered using a photo-lithographic process for this purpose. However, the inventor has experienced some difficulties in carrying out photolithography directly on several such polymer films, since the polymer film material may dissolve (very readily in some cases) in organic solvents which are normally used either to develop the photolithographic polymer mask pattern or the remove subsequently this polymer mask pattern from the film. Degradation of the film properties (e.g. pyroelectric and ferroelectric properties) may also occur by contamination from the photoresist mask. The use of lamination techniques to apply electrode patterns to polymer films has also not proved satisfactory in terms of reliability and reproducibility. Furthermore, studies leading to the present invention indicate that improved pyroelectric and/or ferroelectric infrared detector element characteristics may be obtained by having a thin polymer film with very thin first electrodes (of even smaller thickness than the small thickness of the film) embedded in one face of the film which is supported free of contact with the mount arrangement of the device, at least over most of the area where the group of infrared detector elements are present.

Most of the electrically active polymer materials used for pyroelectric and/or ferroelectric infrared detectors are also piezoelectric. Similar problems to those described above can arise in providing fine-geometry patterns of electrodes for other electrical transducer devices (i.e. not only in infrared detectors), which have piezoelectric polymer films between first and second electrodes.

SUMMARY OF THE INVENTION

In accordance with one aspect of the present invention, there is provided a method of manufacturing an electrical transducer device (particularly but not exclusively an infrared detector array) comprising an electrically active film of polymer material, the film having one or more properties selected from the group of pyroelectric and/or ferroelectric and/or piezoelectric whereby electric charges are generated at first and second opposite faces of the film in operation of the transducer device, a pattern of first electrodes at the first face of the film, and at least one second electrode at the second face, which first and second electrodes form electrical connections to the film for detecting the generated charges and so define with the intermediate areas of the film a group of transducer elements, which method comprises the steps of:

(a) forming the first electrodes on a support by depositing electrode material on a major surface of the support and by using a photo-lithographic process to form a mask pattern which defines the pattern of the first electrodes formed from the electrode material and which is removed before providing the film, (b) depositing the polymer material for the film, on the major surface of the support and over the first electrodes thereon, to a thickness larger than that of the first electrodes and so forming the film on the support with the pattern of first electrodes embedded in contact with the first face of the film adjacent to the support whereby the embedded first electrodes provide the electrical connections for detecting the generated charges at the first face of the film, (c) removing the support at least in the area of the first electrodes to free that area of the first face of the film which now supports the embedded first electrodes, and (d) providing at least one second electrode at the second face of the film opposite the embedded first electrodes so as to define with the intermediate areas of the film the group of the transducer elements.

According to another aspect of the present invention, there is provided an electrical transducer device (particularly but not exclusively an infrared detector array) comprising an electrically active film of polymer material, the film having one or more properties selected from the group of pyroelectric and/or ferroelectric and/or piezoelectric whereby electric charges are generated at first and second opposite faces of the film in operation of the transducer device, a group of first electrodes at the first face of the film, at least one second electrode at the second face, which first and second electrodes form electrical connections to the film for detecting the generated charges and so define with the intermediate areas of the film a group of transducer elements, and a mount arrangement on which the film is supported in the device, characterised in that, where the group of transducer elements are present, at least most of the area of the first face having the first electrodes is free of contact with the mount arrangement, and in that the group of the first electrodes is of smaller thickness than the film and is embedded in said first face of the film in electrical connection with the electrically active polymer material whereby the embedded electrodes are supported by the film.

The use of a photo-lithographic process permits fine-geometry patterns of the first electrodes to be formed so that, for example, densely-packed linear arrays or two-dimensional arrays of infrared detector elements or piezoelectric elements can be formed in the polymer film. By completing the photolithographic process (including the removal of the mask pattern) before providing the polymer film, the carrying out of the photolithographic process does not degrade or otherwise affect the polymer film. The polymer material bonds well to the first electrode pattern so permitting the first electrodes to be transferred to the film upon removal of the support in that area. By removing the support in the described area to free the face of the film, the film with its embedded electrodes can be supported on a mount arrangement free of contact with most of the area of the film where the group of detector elements are present. By providing thin first electrodes embedded in one face of the polymer film, good adhesion and support of the first electrodes by the polymer material can be obtained without significant straining of the electrically active film. This arrangement is advantageous for piezoelectric transducers and can be particularly advantageous for infrared detector elements with a polymer film having pyroelectric and/or ferroelectric properties. Thus, the thinness of the first electrode pattern can reduce heat conduction through the first electrodes to and from the detector elements, so increasing the thermal isolation. Because the thin first electrodes are embedded in one face of the polymer film, the polymer film material envelopes the edges of each first electrode and extends between the facing edges of adjacent first electrodes; it seems that this arrangement may improve the atomic cleanliness of the electrode-film interface in the active transducer-element areas, and provide better control of surface space-charge effects and the electrical contact properties. These factors are important for the transducer element characteristics. Furthermore by forming the electroded film in accordance with the present invention advantageous arrangements can be achieved for the application of an electric field to pole the film material.

It may be noted that it has been proposed previously in the circuit board and connector art to form conductor tracks first on a sacrificial support, and then to incorporate the conductor tracks in an insulating substrate, after which at least part of the support is removed to expose the conductor tracks embedded in the face of the substrate. Such track-transfer circuit-board technology is disclosed in published UK patent application GB-A-2 096 402 and published European patent applications EP-A-0 192 349, EP-A-0 073 904 and EP-A-0 053 490. The sacrificial support (or at least a conductive surface layer) may be used as a cathode for electroplating the tracks to the desired thickness. The conductor tracks are very thick (for example of the order of 10 micrometres or more). The insulating substrate is much thicker and is typically laminated to this plated structure to provide the final support for these thick conductor tracks. The conductor tracks provide connections between other electrical components and do not form an electrical connection to the insulating material of the substrate; the insulating material of the substrate is not electrically active in these circuit board and connector structures and does not form a transducer.

The present invention provides a method of manufacturing an electrical transducer device comprising an electrically active film of polymer material having first and second electrodes at opposite faces, wherein the first electrodes are formed on a support as a pattern of deposited material and are then transferred to the film by depositing material to form the film on the support and over the electrodes and then removing the support at least in the area of the electrodes. It was a matter of surprise that satisfactory electrode connections to an electrically active polymer film can be obtained (with regard to both physical and electrical properties) by transferring the electrodes in this manner to the face of the film. It was particularly surprisingly in the case of infrared detector elements, having regard to the electrode and film thicknesses and nature of the polymer materials with pyroelectric and/or ferroelectric properties (and generally also piezoelectric properties) which are used for these devices. Thus, the polymer films employed in such devices are typically less than 5 micrometers thick and the first electrodes are typically one or more orders of magnitude thinner.

In a method in accordance with the present invention the electrically-active material may be deposited as a Langmuir-Blodgett film on the support and over the electrodes. Such a polymer film can be pyroelectric and/or piezoelectric without a poling (also called polarizing) treatment. However, when a poling treatment is required for the polymer fim material, a method in accordance with the present invention preferably further comprises the step of (e) forming connections to the first and second electrodes at the opposite faces of the film and therewith applying an electric field across the thickness of the film between the first and second electrodes to pole the pyroelectric and/or ferroelectric and/or piezoelectric film. The steps (d) and (e) may be performed after or before freeing said area of the film in step (c). However it can be beneficial to maintain the electroded film on the support during poling, because poling can generate large stresses in the film.

The pattern of first electrodes embedded in the face of the film may include conductor tracks extending from each electrode. In this case at least one area of the film remote from the first electrodes may be removed to expose part of the conductor tracks for forming connections to the first electrodes in step (e). This film area may be removed while the film is held on at least part of the support. Such a configuration with conductor tracks from the first electrodes may be used in, for example, linear arrays of infrared detector elements.

In an important embodiment the support has an electrically conductive surface layer at said major surface, and this surface layer electrically connects the pattern of first electrodes together at said first face of the film during the poling step (e). This can provide a more homogeneous poling of the film, and permits poling of the pyroelectric and/or ferroelectric and/or piezoelectric film even in situations where the first electrodes are separate electrode areas laterally surrounded at the face of the film by the polymer material. This is therefore particularly useful for devices where the pattern of the first electrodes at said first face comprises a two-dimensional array of separate electrode areas.

This conductive surface layer or another type of surface layer at said major surface of the support may also assist in removal of the support from the film and/or protect the face of the film during the removal of the bulk of the support, as will be described hereinafter.

The electrode material deposited in step (a) may comprise a protective layer (for example, gold) below an electrode layer, which protective layer may protect the electrode layer against removal during the removal of the support in step (c). This permits greater freedom in the choice of the material and thickness of the electrode layer. After the support removal step (c) the protective layer may be removed to leave the electrode layer embedded as the electrode pattern in the first face of the film. In this way a very thin first electrode pattern having a low thermal capacity can be obtained. However, the protective layer may be retained in the manufactured device as part of the electrode pattern embedded in the first face of the film, for example as the bulk of the electrode or conductor track of the electrode or as a reflective coating on infrared detector elements.

BRIEF DESCRIPTION OF THE DRAWING

These and other features in accordance with the invention are illustrated specifically in embodiments of the invention now to be described, by way of example, with reference to the accompanying diagrammatic drawings. In these drawings.

Figure 1:
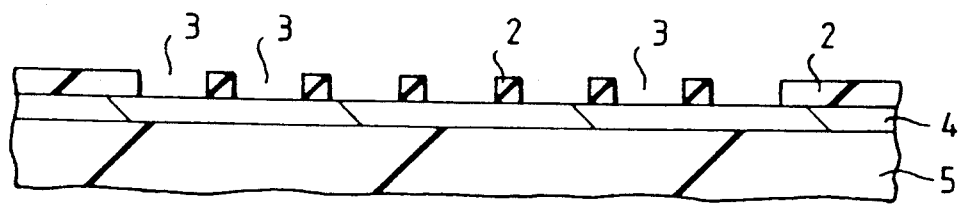
FIG. 1 is a cross-sectional view of a support structure at an early stage in the manufacture of a thermal-radiation sensing device by a method in accordance with the invention.

It should be noted that the accompanying drawings are diagrammatic and not drawn to scale. The relative dimensions and proportions of parts of these Figures (especially in the direction of thickness) have been shown exaggerated or reduced in size for the sake of clarity and convenience in the drawings. The same reference signs as used in one embodiment are generally used when referring to corresponding or similar parts in other embodiments.

DESCRIPTION OF THE PREFERRED EMBODIMENTS

Figure 8:
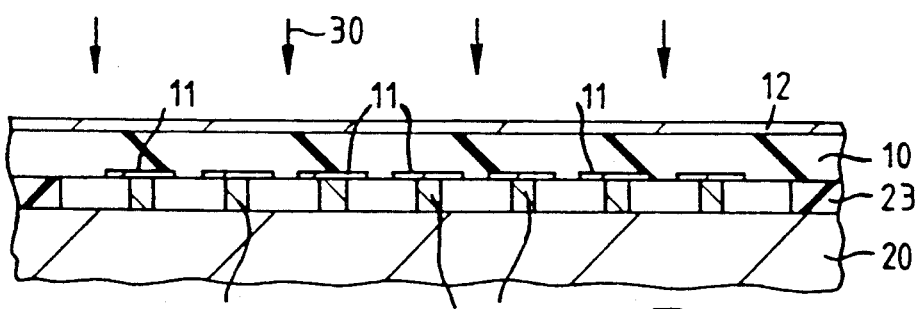
FIG. 8 is a cross-sectional view of the manufactured thermal-radiation sensing device in accordance with the invention.

FIG. 8 illustrates a thermal-radiation sensing device for sensing infrared radiation 30 from a scene, comprising an electrically-active film 10 of polymer material. The film 10 has pyroelectric and/or ferroelectric properties and is sandwiched between first and second electrodes 11 and 12 respectively. There is a group of the first electrodes 11 forming separate electrical contacts at a first face of the film, and at least one second electrode 12 forms an electrical contact at the opposite face so as to define with the intermediate polymer film material a group of infrared detector elements of pyroelectric and/or ferroelectric properties. The electric charges pyroelectrically generated at these opposite faces are detected by means of these electrodes 11 and 12. The film 10 is supported in the device on a mount arrangement 20,21,23. In accordance with the present inveniton, where the group of infrared detector elements are present, at least most of the area of the first face having the first electrodes 11 is free of contact with the mount arrangement 20,21,23, and the group of the first electrodes 11 is of smaller thickness than the film 10 and is embedded in said first face of the film 10 whereby the embedded electrodes 11 are supported by the film 10. This device is manufactured by a method in accordance with the invention, in which the electrodes 11 are formed on a support 4,5 as a pattern of deposited material and are then transferred to the film 10 by depositing the film 10 on the support 4,5 and over the electrodes 11 and then removing the support 4,5 as least in the area of the electrodes 11.

Figure 7:

The method which is now to be described with reference to FIGS. 1 to 7 includes the steps of:

(a) forming the electrodes 11 on a support 4,5 by depositing electrode material 1 on a major surface of the support 4,5 (see FIG. 3), and using a photo-lithographic process (FIG. 1) to form a polymer mask pattern 2 which defines the pattern of the electrodes 11 from the electrode material 1 and which is removed before providing the film 10, (b) depositing the polymer material 10 for the film, on the major surface of the support 4,5 and over the electrodes 11 thereon, to a thickness larger (for example more than 10 times larger) than that of the electrodes 11 and so forming the film 10 on the support 4,5 with the pattern of electrodes 11 embedded in contact with the face of the film 10 adjacent to the support 4,5 (see FIG. 5), and (c) removing the support 4,5 to free the face of the film 10 which now supports the electrodes 11 embedded therein (see FIG. 7).

Figure 2:
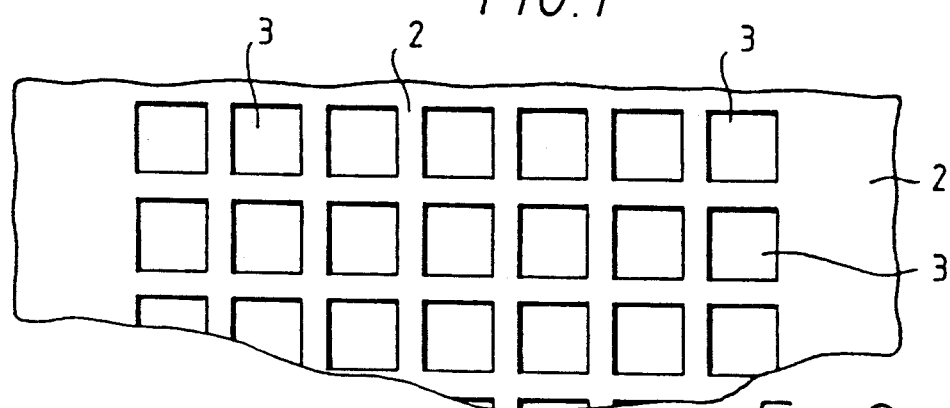
FIG. 2 is a plan view of the structure of FIG. 1.
Figure 3:
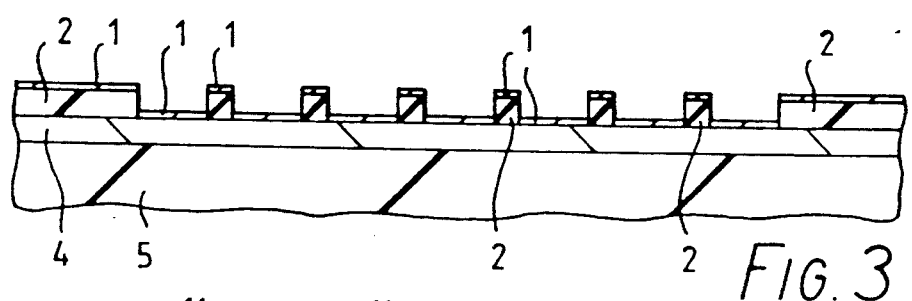
FIGS. 3 to 7 are cross-sectional views of the support structure of FIGS. 1 and 2 and an electroded polymer film (corresponding to the cross-section of FIG. 1) at later stages in the manufacture.

This method permits the fabrication of a fine-geometry pattern, for example a densely-packed two-dimensional array of first electrodes 11 embedded in a face of the polymer film 10, and the polymer film may be of a material which is poled in situ on the support 4,5 using connections to its opposite electrodes 11 and 12 as will be described hereinafter. FIGS. 1 and 2 illustrate a support 4,5 suitable for these purposes. The support 4,5 has an electrically conductive surface layer 4 (for example, of aluminium) at its upper major surface. The bulk 5 of the support may be of, for example, glass.

A photoresist emulsion is coated onto the support 4,5 in known manner and is exposed to an ultraviolet light pattern either through a contact mask or by image projection in known manner to define a desired pattern of polymerized resist in the emulsion. Then, by developing the resist material in known manner, a polymer mask pattern 2 is left on the support 4,5. This mask pattern 2 has openings 3 therethrough at the areas where the electrodes 11 are to be formed on the support 4,5. In the particular example illustrated in FIG. 2, these openings 3 are separate square areas arranged in a 2-dimensional X-Y array. In a compact 2-dimensional array of infrared detector elements, the square areas 3 may be, for example, 50 micrometers by 50 micrometers and may be separated by, for example 15 micrometer wide strips of the mask pattern 2. In a typical case, the mask pattern 2 may be, for example about 3 micrometers thick.

Figure 4:
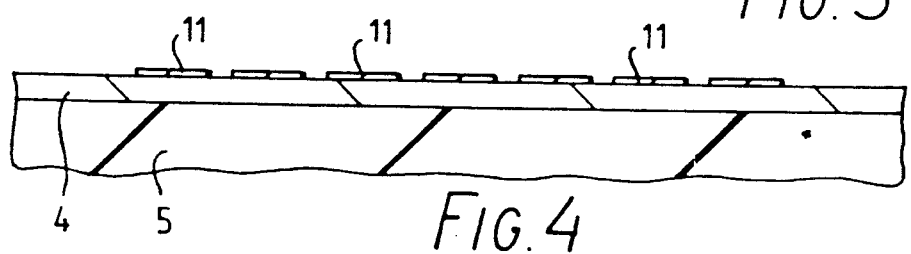

The electrode material 1 is now deposited on the support 4,5 with the mask pattern 2. For this purpose a seed layer of sputtered nickel-chromium may first be deposited, after which gold may be evaporated to form the main part of the layer 1. This gold may form the electrical contact to the polymer film 10. However, a further electrode layer (of nickel chromium) may be deposited on the gold in some cases, for example when it is desired for this nickel chromium layer to form the contact with the polymer film 10 or perhaps even to form the whole of the electrodes 11 as retained in the detector element areas of the manufactured device. The total thickness of the layer 1 (both gold and nickel-chromium) is very small, for example less than about 50 nm (nanometers). The pattern of the electrodes is now defined by removing the mask pattern 2 to lift away the deposited electrode material 1 thereon so as to leave only that in the openings 3. The mask pattern 2 is removed in known manner by dissolving in an organic solvent. The resulting structure is illustrated in FIG. 4.

Figure 5:
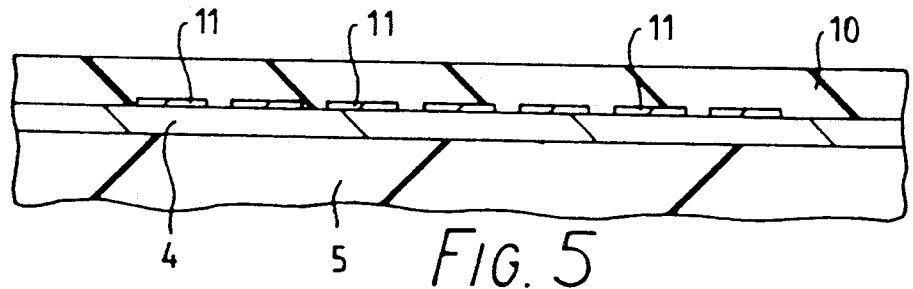
Figure 6:
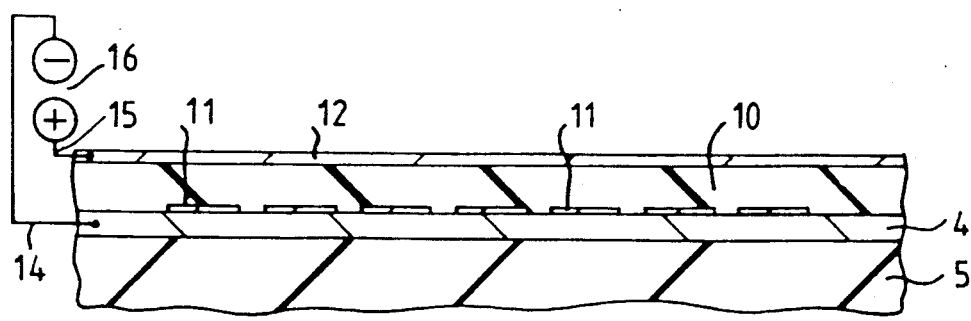

The active polymer film 10 may be formed on the upper major surface of the support 4,5 and over the electrodes 11 thereon by solvent casting. A solution of the material for the film 10 may be spun onto the surface in known manner, after which the solvent is evaporated by heating in known manner to leave the polymer film material 10 on the structure. The polymer film 10 formed in this manner may be, for example, about one quarter of a wavelength in its optical thickness, in accordance with the teaching in EP-A-0 269 161. Thus, in a typical case of an array of pyroelectric detector elements for infrared detection in the wavelength range of about 5 to 15 micrometers, the film 10 may be, for example, between 1.5 and 2 micrometers thick. The resulting structure is illustrated in FIG. 5.

Although a number of different polymer materials may be used for the thin film 10, in a preferred embodiment of the invention the pyroelectric polymer film 10 comprises a vinylidene fluoride polymer. This may be a vinylidene fluoride copolymer or terpolymer, or a mixture or blend of such polymers. It has been found particularly preferable to use a vinylidene fluoride copolymer, for example a vinylidene fluoride copolymer including at least one other copolymerizable halogenated monomer such as trifluoroethylene, tetrafluoroethylene or vinylfluoride, as these have good pyroelectric properties and are considered better so far as their workability is concerned. Examples of the above materials are widely available commercially from a variety of manufacturers including Solvay, Pennwalt Corporation, Raychem Corporation and Kureha. Details of such suitable pyroelectric polymers are to be found in a number of recent patent specifications including, for example, European patent applications EP-A-0 053 332, EP-A-0 131 231, EP-A-0 181 538, and EP-A-0 174 838, whose disclosures in this respect are hereby incorporated herein as reference material.

Particularly good results have been achieved using a vinylidene fluoride trifluoroethylene copolymer. This material has an important advantage, so far as the present invention is concerned, over older types of pyroelectric polymers such as, for example polyvinylidene fluoride (PVDF) material. The latter material, which has found a limited use in the infrared radiation detector device field, needs to be both stretched and poled in order to function satisfactorily as a pyroelectric element. The copolymer vinylidene fluoride trifluoroethylene, however, does not require stretching, only poling, and can readily be formed into films having thicknesses as low as 1.5 micrometres without difficulty. The use of this material in an infrared detector is described in EP-A-0 269 161. A particular example of this material which has been used with success and found to provide very good results is a vinylidene fluoride trifluoroethylene copolymer obtained from Solvay et Cie of Belgium under their reference VF2/TrFE and containing 21 mol percent of trifluoroethylene.

In order to form pyroelectric detector elements from this polymer film 10 it is necessary to electrically pole the copolymer material, for example using the second electrode(s) 12 which is now provided at the other face of the film 10. The sheet resistance of this electrode 12 is preferably chosen in accordance with the teaching in EP-A-0 269 161. The electrical poling (also termed "polarizing") of the polymer material is carried out in accordance with the invention by forming connections 14 and 15 to the electrodes 11 and 12 at the opposite faces of the film 10 and therewith applying an electric field (from a voltage supply 16) across the thickness of the film 10 between the electrodes 11 and 12. The conductive surface layer 4 of the support 4,5 electrically connects the pattern of separate electrode areas 11 together at the face of the film 10 during this poling step. The film 10 may be heated to improve its crystalline material properties before poling and/or during poling. The poling may be effected with field cycling in known manner, for example as described in published United Kingdom patent application GB-A-2 139 810 or European patent application EP-A-0 207 347. The whole contents of both these patent applications are hereby incorporated herein as reference material. The presence of the conductive layer 4 between the electrodes 11 can also lead to a more homogeneous poling of the film 10 between its opposite faces. Because poling can generate large stresses in the thin film 10, it is beneficial for the film 10 to be held on the support 4,5 during the poling treatment.

The support 4,5 is then removed from the poled electroded polymer film 10 by exposing the support 4,5 to a suitable etchant or etchants. In the case of an aluminium-on-glass support 4,5, this may be effected by, for example, etching away the glass 5 in hydrofluoric acid, and then etching away the aluminium layer 4 in sodium hydroxide. During the etching away of the bulk 5 of the support, the surface layer 4 protects the adjacent face of the film 10 and the electrodes 11 embedded therein. The surface layer 4 of the support is of a material (for example, aluminium) which is dissolvable preferentially with respect to both the polymer material 10 and the electrodes 11 so as to free the face of the film 10 having the electrodes 11 embedded therein. In cases where the surface layer 4 is sufficiently thick, the bulk 5 of the support 4,5 may be removed before the poling step to leave the aluminium connection layer 4 adjacent the face of the film 10, and this layer 4 may be dissolved after the poling step to free the electroded film 10. It is also possible to pole the electroded film 10 on the support 4,5 and then to dissolve preferentially the surface layer 4 with respect to the bulk 5 of the support so as to detach the bulk 5 of the support from the film when freeing the first face of the film 10.

The poled, electroded pyroelectric/ferroelectric polymer film 10 freed from the support 4,5 is then mounted on a mounting arrangement 20,21,23 of the thermal-image sensing device. In the particular form illustrated in FIG. 8, the arrangement may comprise, for example, a semiconductor integrated circuit substrate 20 containing field-effect transistors and other electronic circuitry for processing the signals from the detector elements. The separate electrodes 11 of the detector elements may be connected to the electronic circuitry by for example metal bumps 21 or in any other known manner. The electroded film 10 spaced from the circuit substrate 20 may be supported on the array of bumps 21 and on peripheral insulating supports 23.

Figure 9:
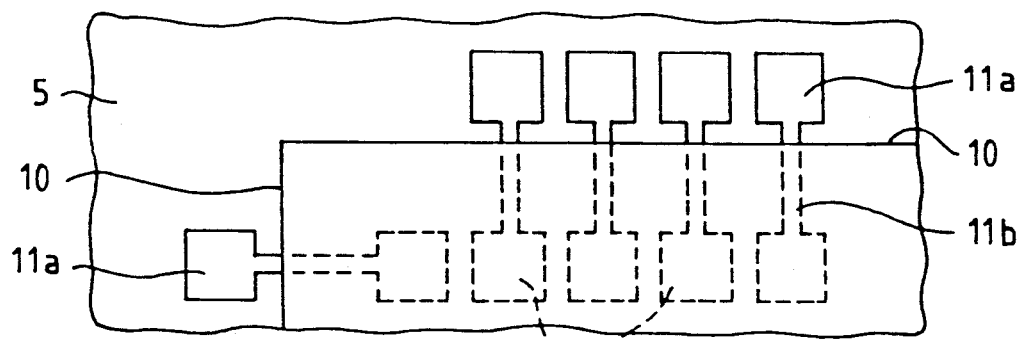
FIG. 9 is a plan view of another device structure at a stage in its manufacture in accordance with the invention.
Figure 10:
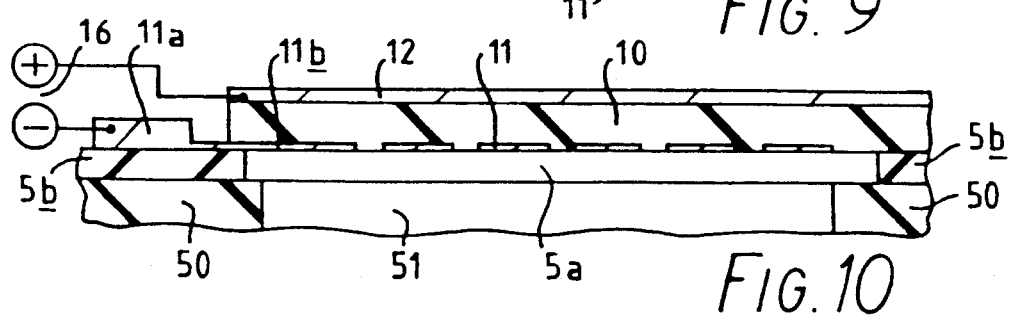
FIG. 10 is a cross-sectional view of the device structure of FIG. 9.

FIGS. 9 and 10 illustrate the application of the invention in a specific form to the manufacture of a linear array of infrared detector elements. In this modification, the electrode pattern 11 is formed on the surface of a continous support 5 (e.g. a thin glass plate 5) mounted on an apertured mount 50 such that the plate 5 covers the aperture 51 in the mount 50. The electrode pattern in this case includes not only the electrodes 11 of the detector elements, but also a conductor track 11a and 11b extending from each electrode 11. Apart from this different geometry, the same photolithographic and metallization steps as described with reference to FIGS. 1 to 4 may be used to form this electrode pattern. The conductor tracks 11a and 11b comprise an enlarged area 11a where an external wire connection is to be made in the final device to each electrode 11. Preferably this area 11a is thickened, for example by gold plating, and in a specific example its thickness may be about one micrometer, in some cases, the area 11a may be thicker even than the thin polymer film 10 subsequently provided in the same manner as described with reference to FIG. 5.

Then, as illustrated in FIGS. 9 and 10 a peripheral area of the film 10 is removed to expose the areas 11a of the conductor track. This may be effected in a variety of ways, for example by plasma etching, or physical stripping, or dissolving this area of the film 10. The electrodes 11 and the part of the tracks 11b which are between the support 5 and the remainder of the film 10 are shown in broken outline in FIG. 9. After depositing a top electrode 12, the film 10 is poled between the electrodes 11 and 12 by an electric field applied via connections to the top electrode 12 and the bottom track areas 11a.

The main central part 5a of the glass plate 5 which is exposed via the aperture 51 in the mount 50 is removed by etching in hydrofluoric acid to expose the area of the film face in which the electrodes 11 are embedded. Nickel-chromium is susceptible to attack by hydrofluoric acid. However, the outside surface of the electrodes 11 and tracks 11b is a gold layer and this gold layer protects the nickel-chromium second layer (embedded between the gold and the polymer film) against removal when etching away the support 5. The gold may be retained in the final device as an infrared reflective layer beneath each detector element. However, if very thin electrodes 11 only of nickel-chromium are desired in the final device, the gold may be etched away with, for example, potassium iodide.

The peripheral part 5b of the glass plate 5 is retained in the manufactured detector device as part of the mount (5b and 50) at least adjacent to the periphery of the film. The wire-bond areas 11a of the electrodes 11 also remain supported by this peripheral part 5b. The poling of the film 10 may be effected before (or after) the removal of the main part 5a of the support 5. The final structure is illustrated in FIG. 10.

Many modifications and variations are possible within the scope of the present invention. Because of the very small thickness of the electrodes 11, it is convenient to form the polymer mask pattern 2 on the support 4,5 before depositing the electrode material 1; the excess electrode material 1 is then simply lifted away with the mask pattern 2. However in accordance with the invention, it is possible to deposit a continuous layer of electrode material 1 on the support 4,5 (before providing a mask pattern) and then to provide the polymer mask pattern photolithographically on the electrode material 1, after which excess electrode material is etched away. In this case, the polymer mask pattern is of complementary shape to the pattern 2 of FIGS. 1 and 2 (i.e. it consists of square mask areas corresponding in geometry to the desired square electrode areas 11), and care is required not to prolong the etching of the thin material 1 which would undercut the edge of the polymer mask pattern.

In the form described hereinbefore the pyroelectric polymer film 10 was deposited by solvent casting on the support 4,5, polymerised by heating and then poled by applying an electric field. In an alternative form, however, the film 10 may be formed by a Langmuir-Blodgett process for multiple deposition of the film material on a glass support 5 carrying the electrode pattern 11. In this case the conductive surface layer 4 is not required because the Langmuir-Blodgett film does not require poling. The electrode pattern 11 is first formed photolithographically on the glass support 5 (by means of a polymer mask pattern 2), and after removing the mask pattern 2 the Langmuir-Blodgett film 10 is formed by cumulative deposition to a thickness larger than that of the electrode pattern 11. The opposite electrode 12 is then deposited, and the glass support 5 is etched away to free the electroded film 10.

In most infrared detector applications of the invention, the material of the film 10 and the design and circuit operation of the detector elements are likely to be chosen so as to utilize the conventional pyroelectric effect in which when a temperature change occurs (for example upon absorption of incident infrared radiation 30 of a thermal image) in a polar crystalline (structured) material exhibiting spontaneous polarization, the material generates electric charges at its opposite faces. By arranging the pyroelectric material in known manner as a capacitor (with electrodes 11 and 12 at the opposite faces) in a suitable amplifying circuit, a current or voltage signal can be developed and detected. Most of the useful pyroelectric materials are also ferroelectric and exhibit their pyroelectric properties in the ferroelectric phase below their Curie point transition temperature. However, infrared detectors may also be constructed in known manner using ferroelectric properties of polymer materials operating in the region of their Curie point where their dielectric constant changes rapidly with temperature. Such ferroelectric infrared detector elements may also be constructed as capacitors with electrode connections at opposite faces 11 and 12. Both these pyroelectric and ferroelectric polymer types of detector elements can be manufactured by methods in accordance with the present invention, in groups on a support 5 or 4,5 which is subsequently removed. Polymer liquid-crystal films with ferroelectric properties may be used. It is also possible to manufacture other types of electrical devices in accordance with the invention, for example pressure-sensitive devices with piezoelectric polymer films between embedded first electrodes 11 and one or more second electrodes 12.

In the examples so far described pyroelectric and/or ferroelectric and/or piezoelectric properties of a homogeneous polymer film 10 have been used to form a thin-film transducer with electrodes 11 and 12. However composite materials may also be used for the polymer film 10. Thus, for example, piezoelectric and/or pyroelectric and/or ferroelectric composite materials are known comprising electrically-active ceramic particles (such as PZT and $PbTiO_3$) in a polymer matrix (such as, for example, polyvinylidene fluoride). Many publications have occurred on such composite materials and their use for piezoelectric, pyroelectric and ferroelectric transducers. By way of example, reference may be made to the journal Ferroelectrics, published by Gordon and Breach Science Publishers S.A., for example vol. 87 and the articles entitled "Poling Studies of Piezoelectric Composites Prepared by Coprecipitated $PbTiO_3$ Powder" on pages 71 to 80 and "Electro-active Properties of Polymer-Ceramic Composites" on pages 213 to 228, the whole contents of which are hereby incorporated herein as reference material. Although both articles describe transducer structures with quite thick films of the composite material with both first and second electrodes deposited thereon, a method in accordance with the present invention may be used to form thin-film transducer devices having a pattern of the first electrodes 11 embedded in a thin polymer film 10 of similar composite materials formed on a temporary support 5.

The use of a photo-lithographic process permits fine-geometry patterns of close-packed first electrodes 11 to be formed. However, photolithography may also be used to form larger geometry patterns, if desired instead of using a stencil mask.

From reading the present disclosure, other variations will be apparent to persons skilled in the art. Such variations may involve other features which are already known in the design, manufacture and use of electroded polymer films, thermal-radiation sensing devices and other transducer devices, groups of infrared detector elements and other transducer elements of ferroelectric and/or pyroelectric and/or piezoelectric material and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalization thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A method of manufacturing an electrical transducer device comprising an electrically active film of polymer material whereby electric charges are generated at first and second opposite faces of the film in operation of the transducer device, a pattern of first electrodes at the first face of the film, and at least one second electrode at the second face, which first and second electrodes form electrical connections to the film for detecting the generated charges and so define with the intermediate areas of the film a group of transducer elements, which method comprises the steps of:
    (a) forming the first electrodes on a support by depositing electrode material on a major surface of the support and by using a photo-lithographic process to form a mask pattern which defines the pattern of the first electrodes formed from the electrode material and which is removed before providing the film,
    (b) depositing the polymer material for the film, on the major surface of the support and over the first electrodes thereon, to a thickness larger than that of the first electrodes and so forming the film on the support and that the pattern of first electrodes is embedded in contact with the first face of the film adjacent to the support whereby the embedded first electrodes provide the electrical connections for detecting the generated charges at the first face of the film,
    (c) removing the support at least in the area of the first electrodes to free that area of the first face of the film which now supports the embedded first electrodes,
    and (d) providing at least one second electrode at the second face of the film opposite the embedded first electrodes so as to form with the intermediate areas of the film, the group of the transducer elements.

2. A method as claimed in claim 1, and further comprising the step of (e) forming connections to the first and second electrodes at the opposite faces of the film and therewith applying an electric field across the thickness of the film between the first and second electrodes to pole the pyroelectric and/or ferroelectric and/or piezoelectric film.

3. A method as claimed in claim 2, wherein the pattern of first electrodes embedded in the first face of the film includes conductor tracks extending from each electrode, and wherein at least one area of the film remote from the first electrodes is removed to expose part of the conductor tracks for forming connections to these first electrodes in step (e).

4. A method as claimed in claim 2, wherein the steps (d) and (e) are performed before step (c).

5. A method as claimed in claim 4, wherein the support has an electrically conductive surface layer at said major surface, and this surface layer electrically connects the pattern of first electrodes together at said first face of the film during the step (e).

6. A method as claimed in claim 5, wherein the pattern of the first electrodes at said first face comprises a two-dimensional array of separate electrode areas.

7. A method as claimed in claim 1, wherein the support has a surface layer of a material which is dissolvable with respect to both the polymer material and the first electrodes so as to free the face of the film in the step (c).

8. A method as claimed in claim 7, wherein the bulk of the support is removed before the step (e) to leave the conductive surface layer adjacent to said first face of the film, and the conductive surface layer is dissolved to free said first face of the film after the step (e).

9. A method as claimed in claim 7, wherein the bulk of the support is dissolvable with respect to the surface layer, and the surface layer protects the first face of the film during the removal of the bulk of the support.

10. A method as claimed in claim 1, wherein the electrode material deposited in step (a) comprises a protective layer below an electrode layer, which protective layer protects the electrode layer against removal during the removal of the support in step (c).

11. A method as claimed in claim 10, wherein after the support removal step (c) the protective layer is removed to leave the electrode layer embedded as the electrode pattern in the first face of the film.

12. A method as claimed in claim 10, wherein the protective layer is retained in the manufactured device as part of the electrode pattern embedded in the face of the film.

13. A method as claimed in claim 10, wherein the protective layer is of gold.

14. A method as claimed in claim 1, wherein a part of the support is retained in the manufactured device as part of a mount at least adjacent to a periphery of the film.

15. A method as claimed in claim 1, wherein the mask pattern is formed on the support before depositing the electrode material on the support and over the mask pattern, and the pattern of the first electrodes is defined by removing the mask pattern to lift away deposited electrode material thereon.

* * * * *